United States Patent [19]

Iverson et al.

[11] Patent Number: 4,788,695
[45] Date of Patent: Nov. 29, 1988

[54] SYSTEM FOR DECODING SELF-CLOCKING DATA SIGNALS

[75] Inventors: Myren L. Iverson, Layton; Vaughn J. Jenkins, Bountiful, both of Utah

[73] Assignee: Unisys Corporation, Blue Bell, Pa.

[21] Appl. No.: 105,380

[22] Filed: Oct. 7, 1987

[51] Int. Cl.[4] .............................................. H04L 27/14
[52] U.S. Cl. ...................................... 375/80; 328/151; 375/110
[58] Field of Search ..................... 375/20, 57, 87, 110, 375/118, 80, 81, 82, 88, 94; 328/127, 151, 155; 307/513, 353, 262; 360/40, 43

[56] References Cited

U.S. PATENT DOCUMENTS

| | | | |
|---|---|---|---|
| 3,626,298 | 12/1971 | Paine | 375/110 |
| 3,789,303 | 1/1974 | Hoffman et al. | 375/57 |
| 4,088,832 | 5/1978 | Eastmond | 375/110 |
| 4,520,321 | 5/1985 | Nakatsugawa | 307/513 |

Primary Examiner—Benedict V. Safourek
Attorney, Agent, or Firm—John B. Sowell; L. J. Marhoefer; T. J. Scott

[57] ABSTRACT

A coherent detection and decoding circuit coherently recovers data embedded in a self-clocking data signal by recovering the clock in one integrate and dump circuit and recovering the data in a second integrate and dump circuit. The two integrate and dump circuits are connected to the source of self-clocking data signal and to one of the outputs from a clock phase select switch which produces an inphase clock signal and a NOT inphase clock signal. The inphase clock signal is connected to the integrate and dump circuit which produces the output data signal and the NOT inphase clock signal is connected to the clock recovery integrate and dump circuit. When the presence of a data pulse is detected in the clock phase detection circuit the output signal is coupled to the clock phase select switch so as to reverse the output clock signals and synchronize the inphase clock signal with the data embedded in the self-clocking data input signal.

15 Claims, 4 Drawing Sheets

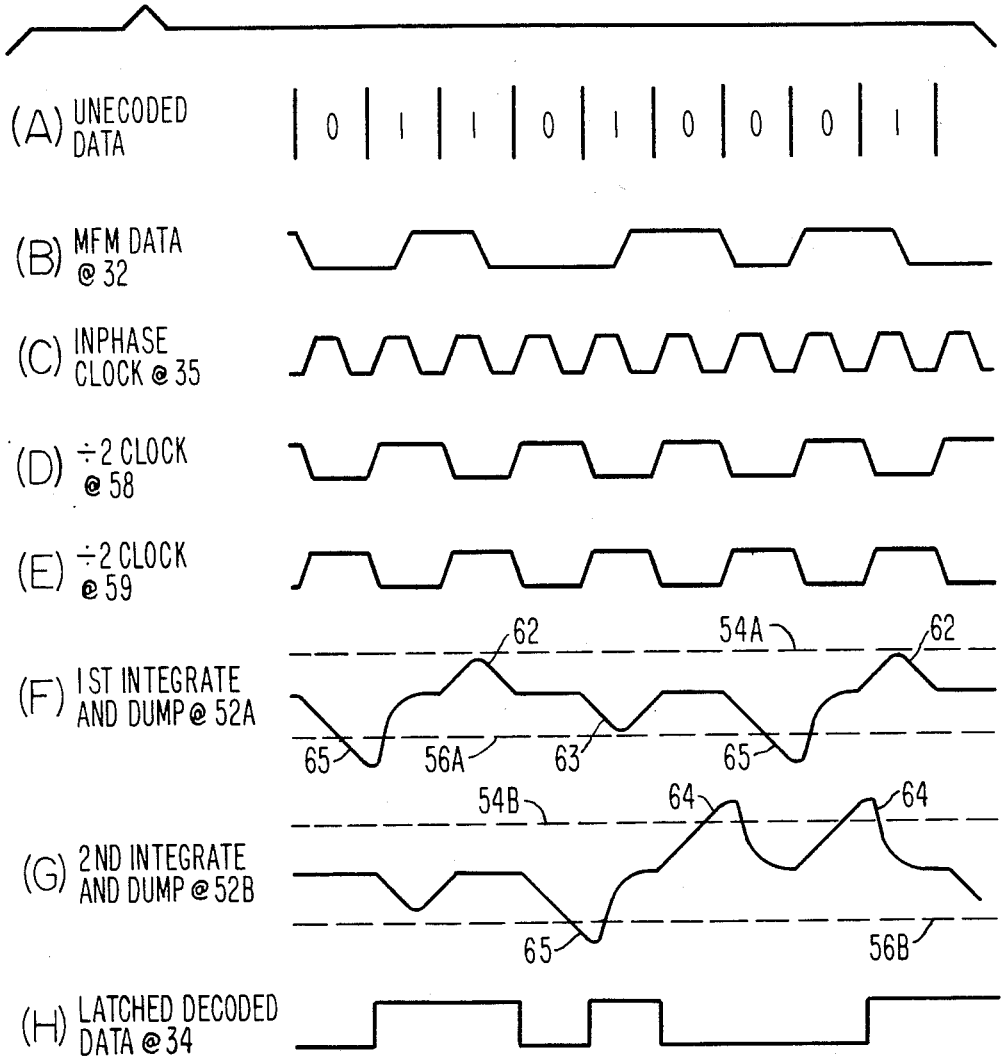

SYSTEM FOR DECODING SELF-CLOCKING DATA SIGNALS

BACKGROUND OF THE INVENTION

1. Field of the Invention

This invention relates to a system for coherently detecting and decoding self-clocking data signals. More specifically the present invention relates to a novel decoder and clock recovery circuit for high frequency self-clocking data signals being transmitted to the input of a decoding receiver at data rates up to 1 gigabyte per second.

2. Description of the Prior Art

Systems are presently available for transmitting unencoded data at rates which exceed one gigabyte per second. Ordinarily such prior art systems employ the technique of multiplexing together data signals of lower frequency to achieve the high frequency signals which are transmitted. If the data signal is encoded but not self-clocking, it is necessary to provide a separate clock channel. With known encoding techniques it is possible to encode the clock and data into a single signal or bit stream which reduces the number of channels required to a single channel. Some self-clocking coding schemes require a band width for the data stream that is twice the band width of the preferred embodiment encoding scheme band width which will be explained hereinafter. At both the transmitting and receiving end of a data link, it is usual to select solid state logic devices whose switching rate defines the data handling rate of the system. By proper selection of a self-clocking encoding scheme it is possible to design a system in which the data rate approaches the switching rate of the logic device selected.

Another problem arises in that it is easier to multiplex and encode for transmission encoded signals than it is to decode the transmitted signals at the receiving end. Several of the reasons which make it more difficult to decode than to encode for transmission arise from the fact that the clock and the data must be recovered from the self-clocking transmitted signal and the transmitted signal is usually attenuated and noisy, thus, any attempt to amplify the received signal also amplifies the noise. When a self-clocking transmitted signal is received and it is possible to derive a clock signal from the self-clocking received signal, it is not known which phase of the clock was used to encode the data signal. When such self-clocking data signals are transmitted at high frequencies in excess of 200 megahertz the noise in the received signal produces jitter of the clock signal which can be so severe in the case of weak signals that it is impossible to recover both the data and the clock signal.

Heretofore systems for decoding self-clocking data signals were not usually designed for extremely high frequencies. When the high frequency transmitter employs fiber-optic cable and photodetectors, the data rates have been limited by the LED or the laser signal-to-light-transducers employed at the transmitting end and by the sensitivity of the photodetector at the receiving end. Commercially available systems for decoding self-clocking data signals have not heretofore been adapted to recovery the data and the clock from high frequency signals transmitted over fiber-optic cables.

It would be extremely desirable to provide an extremely sensitive and reliable system for decoding self-clocking data signals which are extremely weak and/or have been transmitted over fiber-optic cables at extremely high data rates.

SUMMARY OF THE INVENTION

It is a principal object of the present invention to provide a new coherent signal decoding system.

It is another principal object of the present invention to provide a new coherent decoding system that uses integration and dump for decoding self-clocking data signals.

It is another principal object of the present invention to provide a new system for decoding high frequency self-clocking data signals employing high frequency integration and dumping of the incoming signal.

It is another principal object of the present invention to provide a novel system for decoding self-clocking data signals at rates up to 1 gigabyte per second.

It is a general object of the present invention to provide a novel decoding circuit for integrating signals over a full bit period of the encoded data signal time.

It is another general object of the present invention to provide a novel decoding circuit for integrating signals over a half bit period of the encoded data signal.

It is another general object of the present invention to provide a new data decoder and clock recovery circuit adaptable for recovery of very weak self-clocking signals transmitted over fiber-optic cables.

According to these and other objects of the present invention there is provided a photodetector and amplifier for processing incoming random self-clocking data signals from a fiber-optic cable device. The amplified signal is applied to a conventional phase lock loop (PLL) to generate a recovered clock signal. The recovered clock signal is applied to the present invention coherent detection and decoding system, which also receives the amplified self-clocking data signal, to produce a synchronized output clock and a decoded data output signal. The novel coherent detection and decoder circuit comprises a phase select logic channel and a data recovery channel each comprising a novel integration and dump circuit therein which permits separation of the clock from the data in weak or attenuated signals at very high frequencies.

BRIEF DESCRIPTION OF THE DRAWING

FIG. 6 is a drawing showing wave forms at different locations in the circuit in FIG. 5.

DESCRIPTION OF THE PREFERRED EMBODIMENT

For purposes of this application coherent detecting and decoding shall mean that both detecting and decoding are forced to be coherent or in phase with the recovered clock.

Figure 1:
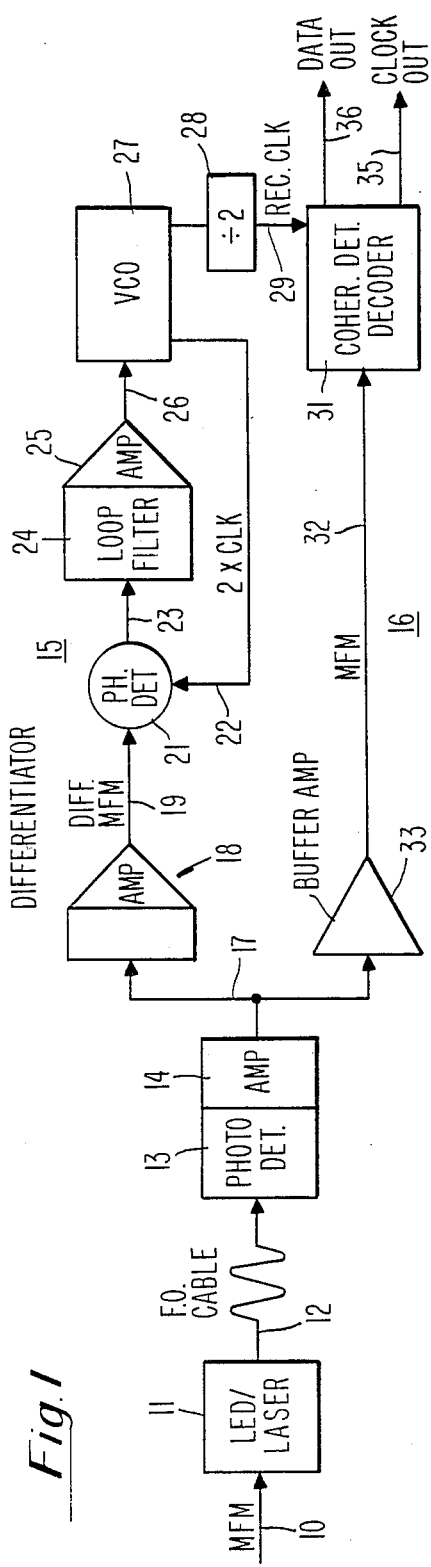
FIG. 1 is a schematic block diagram of a receiver of the type having a fiber-optic cable and photodetector input and showing the present invention novel detector decoder.

Refer now to FIG. 1 showing the environment in which the preferred embodiment coherent detection decoder may be employed. Encoded signals, such as modified frequency modulation (MFM) signals, are on line 10 being applied to a converter of the type which converts electrical signals to light signals in transducer converter 11 such as a LED or laser. The light output from converter 11 is applied to a fiber-optic cable 12 and transmitted to the detection source, shown as a photodetector 13, and amplifier 14 to produce an electrical signal which is applied to the clock recovery loop 15 and the data recovery loop 16. As explained hereinbefore the signal on line 10 and the signal being fed into the loops 15 and 16 on line 17 is a self-clocking data signal from which the clock must be recovered from the signal which also contains the data. The electrical signal on line 17 is applied to a differentiating amplifier 18 to produce a differentiated MFM signal on line 19. This signal is applied to a phase detector 21 which also has an input on line 22 shown as 2 times the clock signal. The output signal on line 23 is proportional to the phase difference between the input signals. The differentiated phase difference signal on line 23 is applied to loop filter 24 and amplifier 25 to eliminate noise and prevent oscillations in the phase lock loop. The voltage error signal on line 26 is applied to the voltage control oscillator (VCO) 27 which produces a clock frequency signal on line 22 that is twice the clock frequency used to encode the data on line 10. The voltage controlled oscillator frequency is divided by 2 at block 28 to produce the same recovered clock frequency on line 29 as was used to encode the signal on line 10. The recovered clock on line 29 is applied to a coherent detector decoder 31 along with the MFM encoded data signal on line 32 previously amplified at amplifier 33. Detector decoder 31 produces a data output signal on line 34 and a recovered clock signal (or true clock signal) on line 35.

As will be explained hereinafter the novel coherent detector decoder 31 is faster than prior art non-coherent detector decoders and filters out more noise, thus, has better sensitivity than non-coherent detector decoder systems.

Figure 2:
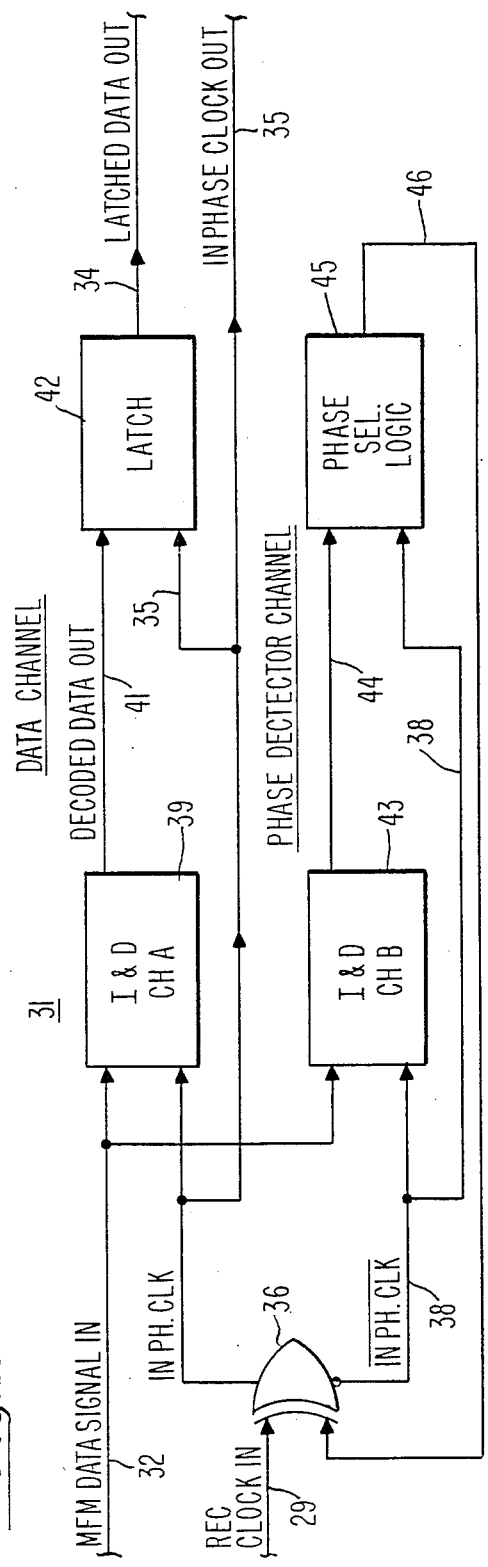
FIG. 2 is a schematic block diagram showing generically the present invention detector decoder.

Refer now to FIG. 2 showing in block diagram form a preferred embodiment of the present invention coherent detector decoder 31. The MFM data signal input is shown on line 32. The recovered clock input is shown on line 29 being applied to an exclusive OR circuit 36 to produce an inphase clock signal on line 35 and a NOT inphase clock signal on line 38. The inphase clock signal on line 35 and the MFM data signal on line 32 are applied to an integrate and dump circuit 39. The output from circuit 39 (channel A or data channel) produces a decoded data output signal on line 41 that is applied to latch 42 which holds the data signal until read out on latch data output line 34. The inphase clock signal on line 35 is employed to read the data out of latch 42. As mentioned hereinbefore, the clock signal which is present in the MFM data signal has a phase which is unknown. Channel A and latch 42 will not properly read out the data unless the clock on line 35 is in the proper phase. Accordingly, there is provided a second integrate and dump circuit 43 (shown as channel B or the phase detect channel) which receives the MFM data signal on line 32 and the NOT inphase clock signal from line 38 to produce a decoded data output signal on line 44 only if the incorrect clock phase has been selected for channel A and circuit 39. Stated differently, no valid data output signal will occur on line 44 if the proper phase has been selected for the data channel A. A phase select logic circuit 45 is coupled to the output of circuit 43 and is operable to produce a valid data output on line 46 if a data signal occurs on input line 44. When a valid data signal is detected by phase select logic 45, it indicates that channel A (the data channel) has an improper inphase clock signal. The phase select logic output on line 46 is applied to exclusive OR circuit 36 to change the state of exclusive OR circuit 36, reversing both the inphase clock on line 35 and the NOT inphase clock on line 38, thus, producing the proper inphase clock signal to the data channel A and integrate and dump circuit 39. Also, when the phase select logic 45 changes the clock signals on lines 35 and 38 it also produces a clock signal on line 38 at integrate and dump circuit 43 which is out of phase with the data on line 32 and inhibits a valid data signal on line 44 at the output of phase select logic 45.

Figure 3:
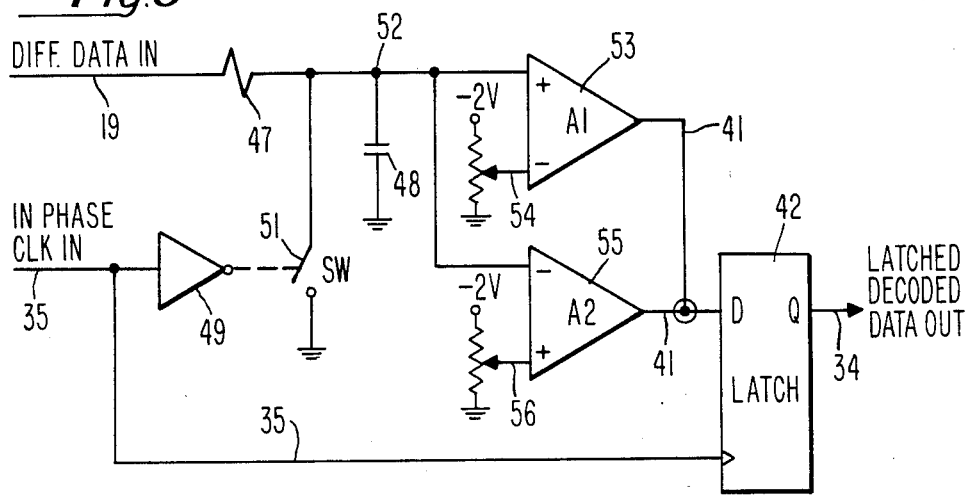
FIG. 3 is a schematic block diagram showing a ½ bit period integrate and dump circuit of the type employed in FIG. 2.

Refer now to FIG. 3 showing a schematic block diagram of a ½ bit period integrate and dump circuit of the type employed in FIG. 2 in blocks 39 and 43. It will be noted that the input signal on line 19 is a differentiated data signal of the type shown in FIG. 1 instead of the non-differentiated data signal on line 32 otherwise the circuit to be explained hereinafter may be inserted without modification into the integrate and dump circuits of channels A and channels B shown as blocks 39 and 43 of FIG. 2. Resistor 47 and capacitor 48 form the integration circuit. Switch driver 49 and switch 51 forms the dump circuit which resets the integrating capacitor 48 at the end of the integration period and prevents any integration during the dump period. The signal on line 19 is integrated at node 52 which produces transitions of the data signal without a DC component. The signal at node 52 is applied to the positive side of comparator 53 which has a high reference level signal on line 54 applied at the negative input. The output of comparator 53 on line 41 is applied to the data side of latch 42. A second comparator 55 has its negative input connected to node 52 and its reference input connected via line 56 to a low level voltage reference to produce an output on line 41 which is hard wire OR connected to the data side of latch 42. The purpose for having two comparators 53 and 55 with adjustable reference inputs is to be able to adjust the thresholds voltages as will be explained hereinafter with reference to FIG. 4.

Figure 4:
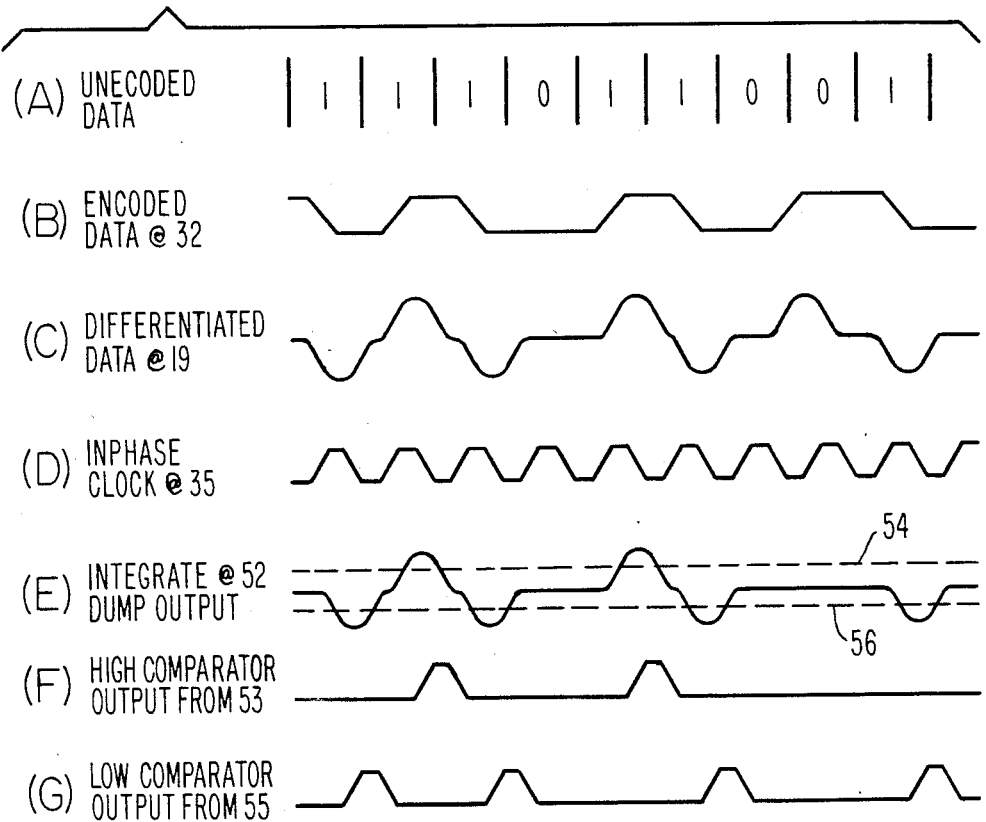
FIG. 4 is a drawing showing a plurality of wave forms which occur at different locations in the circuit of FIG. 3.

Refer now to FIG. 4 showing wave forms which occur in the circuit of FIG. 3. The unencoded data shown as FIG. 4A is not shown on any of the aforementioned drawings, however, the data on line 32 is shown as FIG. 4B and the differentiated data at line 19 is shown as FIG. 4C. The inphase clock at line 35 is shown as FIG. 4D. The processed signal at node 52, which is the output of the integrate and dump circuit, is shown as FIG. 4E. Superimposed on FIG. 4E as dotted lines are the reference voltage threshold levels which occur on lines 54 and 56 respectively. The output on line 41 is a composite of the voltage output from the high comparator 53 and the low comparator 55 shown as FIGS. 4F and 4G respectively. It will be understood that the data on line 41 being applied to the latch 42 is the wired OR combination of the two inputs shown on FIGS. 4F and 4G. The wave forms of FIG. 4 show that the encoded data on lines 19 or 32 are detected and decoded to form the output on line 41 as shown in FIGS. 4F and 4G. In FIGS. 3 and 4, the integration during the data period has occurred during ½ bit period or ½ clock cycle. Thus, even though this circuit is simpler, it requires faster logic and is less sensitive than the preferred embodiment circuit to be explained with reference to FIGS. 5 and 6 hereinafter.

Figure 5:
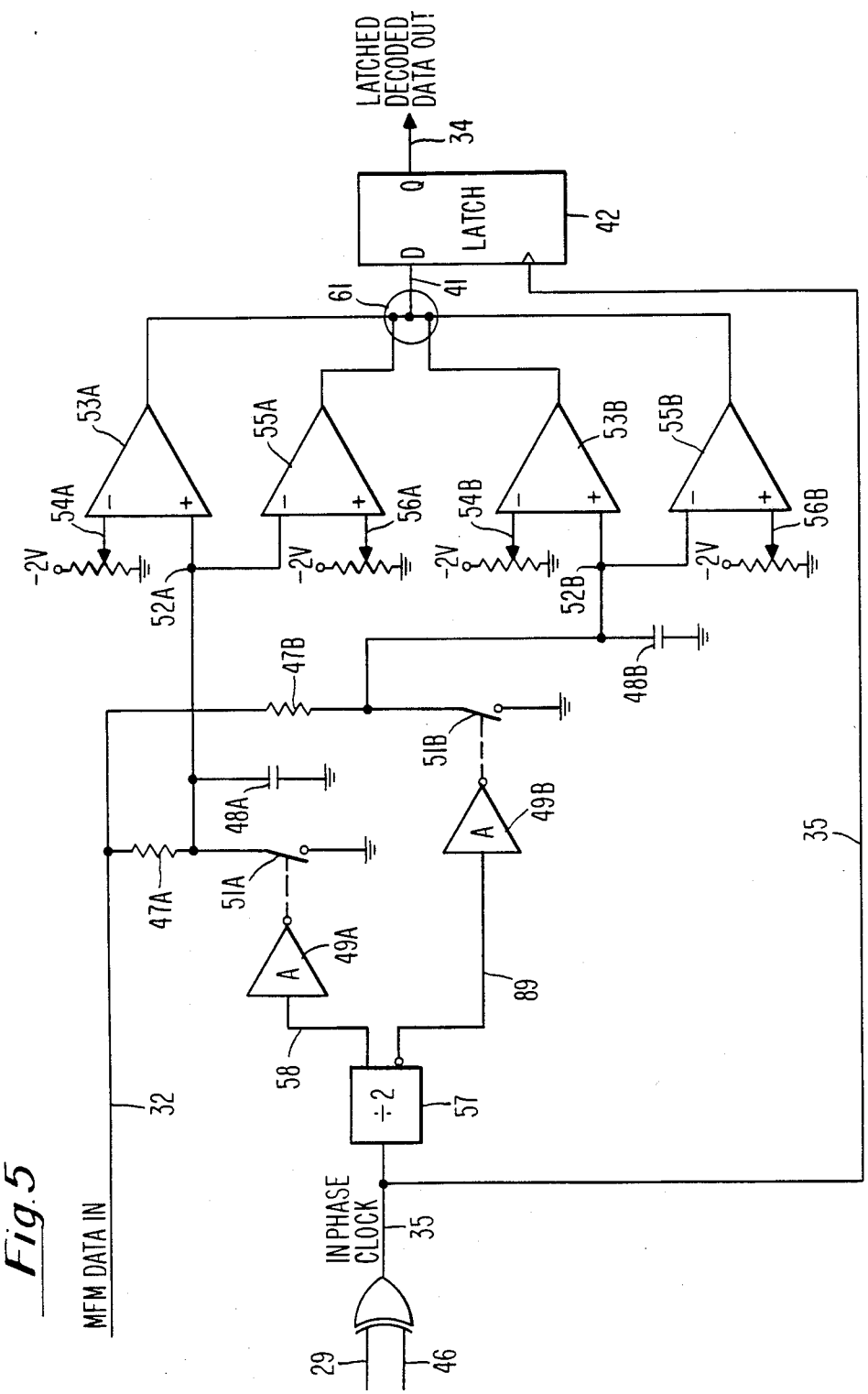
FIG. 5 a schematic block diagram of a full bit period integrate and dump circuit of the type employed in FIG. 2.

Refer now to FIG. 5 showing a preferred embodiment integrate and dump circuit where integration occurs over the full bit period. The coherent detector decoder 31 shown in FIG. 1 may comprise two or four integration and dump circuits 39 and 43. Each of the block 39 and 43 comprise two integration and dump circuits in the FIG. 5 embodiment. The data signal input on line 32 is the same as that shown in FIG. 1. The inphase clock input on line 35 is the same as that shown in FIG. 2 as the output from the comparator 36 (which also produces the latch decoded data out on line 34 in FIG. 2). The inphase clock signal on line 35 is applied to a divide by two circuit 57 to produce two inphase clock signals at half the inphase clock signal rate occurring alternately on lines 58 and 59. The inphase clock signal on line 58 is applied to switch driver 49A of a first integrate and dump circuit (shown as 47A, 48A, 49A, 51A) of the type explained with respect to FIG. 3. The inphase clock signal on line 59 occur intermediate the inphase clock signal on line 58 and may be defined as being the NOT inphase clock divided by two. The clock signal on line 59 is applied to a second integrate and dump circuit 47B, 48B, 49B 51B of the type shown and explained with regards to FIG. 3. The numbers applied to the elements of the integrate and dump circuit in FIG. 3 are also applied to the two alternately clock signal driven integrate and dump circuits shown in FIG. 5 employing the letters A and B as postscripts. The outputs of all four comparators 53A, 55A, 53B, 55B are hard wired ORed together at node 61 to produce a composite signal on line 41 which is applied to the data input of latch 42 to produce the latched decoded data output signal on line 34. The advantage of duplicating the integrate and dump circuits of FIG. 3 in FIG. 5 is that integration occurs over a full bit period which increases the sensitivity of the decoder 31 and only requires half the speed requirements for the logic elements employed in the circuit of FIG. 5.

Refer now to FIG. 6 showing wave forms at different locations in the circuit of FIG. 5. FIG. 6A shows the unencoded data which is shown MFM encoded on line 32 in FIG. 6B. The inphase clock signal on line 35, shown in FIG. 6C, is divided by two at circuit 57 to produce the two clock signals on lines 58 and 59 shown in FIG. 6D and 6E as being 180° out of phase and at half the rate of the clock signal on line 35. The individual outputs of the first and second integrate and dump circuits at nodes 52A and 52B are shown at FIGS. 6F and 6G. The threshold voltages shown at phantom lines 54A and 56A are different from those explained hereinbefore. The threshold for line 54A is set above the peaks generated by the "1s" in the data but set at 56A below the peaks set for the "0s" in the data. For example, the threshold level 54A is set above the positive "1" peaks 62 and the threshold voltage level 56A is set below the negative "1" peak 63 in FIG. 6F. Similarly the threshold levels 54A and 54B are set below the positive "0" peak levels of the peaks 64 and the threshold levels 56A and 56B are set below the negative "0" peaks 65 as shown in FIGS. 6F and 6G. The latch decoded data output on line 34 is shown in FIG. 6H shifted for convenience of this explanation to lineup with the data shown in FIG. 6A and appears here shifted to the left one clock period with relation to the data shown in FIGS. 6F and 6G.

Having explained a preferred embodiment of the present invention it will be appreciated that the present invention system is particularly suited for and adapted to receive signals over fiber-optic cables which signals have been encoded from data signals to light signals by LEDs or lasers at the input and decoded at the output by means of a photodetector. If the encoded signals are encoded with an NRZ or NRZI code which is not self-clocking, a separate clock signal must be transmitted. However, if a self-clocking code such as a Manchester code is employed, the data rate is only one-half the separate clock rate of the NRZ code for the same data. If, however, an MFM code is employed for encoding the self-clocking data, the same higher rate as the NRZ or NRZI code is achieved without the necessity of a separate clock.

In the preferred embodiment shown in FIGS. 5 and 6 two integrate and dump circuits are employed during alternate time periods so that the clock rate of each of the integrate and dump circuits is only one-half the full clock rate and the device logic employed can be lower speed logic than that required for one-half bit period integration as employed in FIGS. 3 and 4. When the data is integrated over a full bit period in each channel in the two integration and dump circuits of FIG. 5, it produces twice the amount of energy for each of the bits being sampled or detected. Therefore, the sensitivity of the FIG. 5 preferred embodiment is approximately twice the sensitivity of the detector circuits shown in FIG. 3.

What is claimed is:

1. A coherent detection and decoding system for decoding self-clocking data signals comprising,
   a source of random self-clocking data signals,
   a clock phase select switch for generating an inphase and a not inphase clock signal whose phase is unknown,
   a data channel having first integrate and dump circuit means coupled to said inphase clock signal and said random self-clocking data signals for producing a decoded data output signal,
   a phase select channel having second integrate and dump circuit means coupled to said not inphase clock signal and to said self-clocking data signals for producing a decoded data output signal when the data is inphase with the not inphase clock signal and is out of phase with the inphase clock signal, and
   said data output signal from said second integrate and dump circuit means being coupled to a second input to said clock phase select switch for setting the correct inphase output and NOT inphase output from said clock phase select switch.

2. A coherent detection and decoding system as set forth in claim 1 wherein said phase detector channel further includes phase select logic means coupled to said NOT inphase clock signal and to the data output signal from said second integrate and dump circuit means indicating a wrong phase selection and for reversing the phase of the output from said clock phase select switch.

3. A coherent detection and decoding system as set forth in claim 1 which further includes latch means coupled to the output of said first integrate and dump circuit means and to said inphase clock signals for sampling and holding the decoded data output signal at the end of each integration period.

4. A coherent detection and decoding system as sef forth in claim 1 wherein said first integrate and dump circuit means includes a pair of integrate and dump circuits having their outputs combined to produce said decoded data output signals.

5. A coherent detection and decoding system for decoding self-clocking data signals comprising:
   a source of self-clocking data signals to be decoded,
   a source of recovered clock signals whose phase in unknown,
   a clock phase select channel comprising a first integrate and dump circuit coupled at its input to said self-clocking data signals and to said recovered clock signals whose phase is unknown,
   a phase select logic circuit coupled to the output of said first ingegrate and dump circuit for detecting the presence of a data signal which occurs during the integration period of said first integrate and dump circuit which indicates an out of phase data condition,
   logic switch means coupled at its input to the output of said phase select logic circuit and to said source of recovered clock signals for generating clock signals that are inphase and NOT inphase with said data signals,
   said logic switch means being adapted to be switched when activated by an output signal from said phase select logic circuit, so that
   said NOT inphase recovered clock signal from said logic switch means being connected to the input of said clock phase select channel, and
   a data channel comprising a second integrate and dump circuit coupled to said inphase clock signals from said logic switch and to said source of self-clocking data signals for generating decoded data output signals.

6. A coherent detection and decoding system as set forth in claim 5 wherein said inphase and NOT inphase clock signals applied to said integration and dump circuits of said channels are at a frequency twice the data rate so that integration occurs over one-half of one bit period 7. A coherent detection and decoding system as set forth in claim 5 wherein said inphase and NOT inphase clock signals applied to said integration and dump circuits of said channels are at the same rate as the data rate so that integration occurs over one full bit period.

8. A coherent detection and decoding system as set forth in claim 2 which further includes divide by two circuit means in the clock input signal circuits to said channels.

9. A coherent detection and decoding system as set forth in claim 2 which further includes divide by two circuit means in the recovered clock signals source to said logic switch means.

10. A coherent detection and decoding system as set forth in claim 7 which further includes a phase lock loop circuit coupled to said source of self-clocking data signals to provide a double data rate clock output, and
    a first divide by two circuit coupled to said double data rate clock output to provide a recovered clock output,
    said logic switch means being coupled to said first divide by two circuit to provide an inphase clock output, and
    a second divide by two circuit coupled to said inphase clock output to provide a source of recovered clock signals at one-half the data rate at said logic switch means.

11. A coherent detection and decoding system as set forth in claim 5 wherein the integrate portion of said integrate and dump circuit of said channels each comprise a resistor and a capacitor connected in series between said source of self-clocking data signals and ground, and wherein
    the dump portion of said integrate and dump circuits of said channels each comprise a normally open solid state switch connected in series between ground and a node point between said resistor and said capacitor.

12. A coherent detection and decoding system as set forth in claim 11 where said integrate and dump circuits further comprise a pair of comparators connected in parallel between said node point and said output of said channels.

13. A coherent detection and decoding system as set forth in claim 12 wherein at least one of said comparators has an adjustable gain control input for setting the threshold levels for detecting said input data signals.

14. A coherent detection and decoding system as set forth in claim 11 wherein said integrate and dump circuits further comprise,
    two pairs of parallel connected integrating circuits each having a dump portion comprising a normally open solid state switch connected to the integrating circuit at a node point, and
    a pair of comparators connected to said node points to provide a combined data signal output.

15. A coherent detection and decoding system as set forth in claim 14 wherein the outputs from said comparators are commonly connected.

* * * * *